(12) United States Patent
Chen et al.

(10) Patent No.: US 6,967,130 B2
(45) Date of Patent: Nov. 22, 2005

(54) METHOD OF FORMING DUAL GATE INSULATOR LAYERS FOR CMOS APPLICATIONS

(75) Inventors: Chi-Chun Chen, Kaohsiung (TW); Tzu-Liang Lee, Hsinchu (TW); Shih-Chang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 26 days.

(21) Appl. No.: 10/600,393

(22) Filed: Jun. 20, 2003

(65) Prior Publication Data

US 2004/0259341 A1 Dec. 23, 2004

(51) Int. Cl.[7] .................... H01L 21/8238; H01L 21/31; H01L 21/302
(52) U.S. Cl. ...................... 438/199; 438/723; 438/724; 438/756; 438/757; 438/770; 438/772; 438/775; 438/777; 438/787; 438/788; 438/791; 438/792; 438/981
(58) Field of Search .................. 438/275, 770–777, 438/787–788, 791–792, 981, 199, 706, 710, 438/723–724, 745, 756–757

(56) References Cited

U.S. PATENT DOCUMENTS

| | | | | |
|---|---|---|---|---|
| 4,715,937 A | * | 12/1987 | Moslehi et al. ............. | 438/776 |
| 5,330,935 A | * | 7/1994 | Dobuzinsky et al. ....... | 438/767 |
| 5,336,356 A | * | 8/1994 | Ban et al. .............. | 156/345.26 |
| 5,960,289 A | | 9/1999 | Tsui et al. ................... | 438/275 |
| 6,030,862 A | | 2/2000 | Kepler ........................ | 438/217 |
| 6,037,224 A | | 3/2000 | Buller et al. ................. | 438/258 |
| 6,110,842 A | | 8/2000 | Okuno et al. ............... | 438/776 |
| 6,121,091 A | | 9/2000 | Wang | |
| 6,262,455 B1 | | 7/2001 | Lutze et al. ................. | 257/369 |
| 6,383,861 B1 | * | 5/2002 | Gonzalez et al. ........... | 438/241 |
| 6,391,803 B1 | * | 5/2002 | Kim et al. ................... | 438/787 |
| 6,436,771 B1 | * | 8/2002 | Jang et al. .................. | 438/275 |
| 6,465,323 B1 | * | 10/2002 | Yu et al. ...................... | 438/424 |
| 6,693,047 B1 | * | 2/2004 | Lu et al. ...................... | 438/770 |
| 6,906,398 B2 | * | 6/2005 | Yeo et al. .................... | 257/500 |
| 2005/0124160 A1 | * | 6/2005 | Chiu et al. ................... | 438/689 |

OTHER PUBLICATIONS

Lucovsky, G, D.V. Tsu, S.S. Kim, R.J. Markunas, G.G. Fountain, "Formation of thin film dielectrics by remote plasma-enhance chemical-vapor deposition (remote PECVD)," Applied Surface Science, vol. 39, Issues 1-4, Oct. 1989, pp. 33-56.*

(Continued)

Primary Examiner—Mary Wilczewski
Assistant Examiner—Toniae M. Thomas
(74) Attorney, Agent, or Firm—Haynes and Boone, LLP

(57) ABSTRACT

A method of forming dual gate insulator layers, each with a specific insulator thickness, featuring a HF type pre-clean procedure performed prior to formation of each of the gate insulator layers, has been developed. After a first HF type pre-clean procedure a silicon nitride layer is deposited on the native oxide free, semiconductor substrate followed by selective removal of silicon nitride layer from a second portion of the semiconductor substrate. After a second HF type pre-clean procedure a silicon dioxide gate insulator layer is formed on the second portion of the native oxide free, semiconductor substrate, with the silicon dioxide gate insulator layer comprised with a different thickness than the silicon nitride gate insulator layer, located on a first portion of the semiconductor substrate. The procedure used to form the silicon dioxide gate insulator layer also removes bulk traps in the silicon nitride gate insulator layer.

33 Claims, 2 Drawing Sheets

OTHER PUBLICATIONS

Wolf, Ph.D., Stanley, Richard N. Tauber, Ph.D., "Dry Etching for VLSI Fabrication," Silicon Processing for the VLSI Era—vol. 1 Process Technology, Lattice Press, 1986, p. 536.*

G. Lucovsky et al., "Formation of thin dielectrics by remove plasma-enhanced chemical-vapor deposition (remote PECVD)", Applied Surface Science, vol. 39, Issue 1-4, Oct. 1989, pp. 33-36.

Stanley Wolf et al., "Silicon Processing For The VLSI Era, vol. 1: Process Technology", Lattice Press, Sunset Beach, CA, 3 pages.

Howard Chih-Hao Wang et al., "Hot Carrier Reliability Improvement by Utilizing Phosphorus Transient Enhanced Diffusion for Input/Output Devices of Deep Submicron CMOS Technology", IEEE Electronic Device Letters, vol. 21, No. 12, Dec. 2000, 2 pages.

Howard Chih-Hao Wang et al., "Arsenic/Phosphorus LDD Optimization by Taking Advantage of Phosphorus Transient Enhanced Diffusion for High Voltage Input/Output CMOS Devices", IEEE Transactions on Electron Devices, vol. 49, No. 1, Jan. 2002, 5 pages.

* cited by examiner

METHOD OF FORMING DUAL GATE INSULATOR LAYERS FOR CMOS APPLICATIONS

BACKGROUND OF THE INVENTION

(1) Field of the Invention

The present invention relates to method used to fabricate semiconductor devices, and more specifically to a method used to form dual gate dielectric layers for specific applications of complimentary metal oxide semiconductor (CMOS), devices, wherein one of the gate dielectric layers is a silicon nitride layer.

(2) Description of Prior Art

Advanced CMOS designs are formed for multiple applications with each application requiring a specific CMOS type device, in turn necessitating the fabrication of different type CMOS devices on the same semiconductor chip. For example CMOS devices such as a device used for input/output (I/O) applications require thicker gate insulator layers for I/O operation than counterpart CMOS devices used for core memory applications, which in turn are used at lower operating voltages thus requiring thinner gate insulator layers. Therefore to satisfy the requirements of the different CMOS applications dual gate oxide processes have been used. The conventional method of forming dual gate oxide layers is to initially grow the thick insulator component on an entire semiconductor substrate followed by removal of the thick insulator layer in the area of the semiconductor substrate requiring the thinner gate insulator layer. The thinner gate insulator layer is then regrown on the bare semiconductor region. However to insure quality of the regrown, thinner insulator layer, a pre-clean in a hydrofluoric acid containing solution should be used to remove native oxide from the region of the semiconductor substrate on which the thinner insulator layer will be regrown. If the pre-clean procedure is omitted the inclusion of the native oxide will degrade the quality of the regrown, thin insulator layer. However if the pre-clean procedure is employed the exposed thicker insulator layer will be thinned, perhaps to a point deleteriously influencing the performance or reliability of the I/O device featuring the thicker gate insulator component.

The present invention will describe a process for forming dual gate insulator layers in which a HF type pre-clean is applied prior to the formation of each gate insulator layer, made possible as a result of the insolubility of the exposed first gate insulator layer in the HF type solution. This allows for complete removal of native oxide from the surface of the semiconductor substrate prior to the growth of the second gate insulator layer, thus avoiding the inclusion of the lower dielectric quality native oxide in the second gate insulator layer. In addition this invention will describe a dual gate insulator process in which the thinner component is formed and exposed prior to formation of a thicker, second insulator layer. Prior art such as Okuno et al, in U.S. Pat. No. 6,110,842, Kepler, in U.S. Pat. No. 6,030,862, Tsui et al, in U.S. Pat. No. 5,960,289, Lutze et al, in U.S. Pat. No. 6,262,455 B1, and Buller et al, in U.S. Pat. No. 6,037,224, describe process sequences for attainment of dual gate insulator layers, however none of the prior art describe the unique process sequence described in this present invention in which dual gate insulator layers are formed using an HF type solution prior to formation of each component of the dual gate insulator layer.

SUMMARY OF THE INVENTION

It is an object of this invention to provide a dual gate insulator layer process sequence to form a first gate insulator layer comprised with a first thickness, on a first region of a semiconductor substrate, followed by formation of a second gate insulator layer comprised with a second thickness, on a second region of the semiconductor substrate.

It is another object of this invention to apply a HF type pre-clean procedure prior to formation of each gate insulator layer, without degrading the thickness of the exposed first gate insulator layer during the application of a second HF type pre-clean procedure, applied prior to second gate insulator formation.

It is still another object of this invention to form a silicon nitride, first gate insulator layer in a first region of the semiconductor substrate, followed by the thermal growth of a thicker silicon dioxide, second gate insulator layer.

In accordance with the present invention a method of forming dual gate insulator layers on a semiconductor substrate, featuring the use of HF type pre-cleans applied prior to formation of each of the gate insulator layers, is described. After application of a first HF type pre-clean, a thin silicon nitride layer is formed or deposited on the surface of a semiconductor substrate. Silicon nitride is selectively removed from the surface of a second region of the semiconductor substrate, with thin silicon nitride still remaining overlying the surface of a first region of the semiconductor substrate. After a second HF type pre-clean procedure a thermal oxidation procedure is performed resulting in the growth of a silicon dioxide gate insulator layer in the second region of the semiconductor substrate, with the thickness of the silicon dioxide gate insulator greater than the thickness of the unoxidized, silicon nitride layer located in the first region of the semiconductor substrate. The thermal oxidation procedure, performed at an elevated temperature, results in removal of bulk traps in the thin silicon nitride gate insulator layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
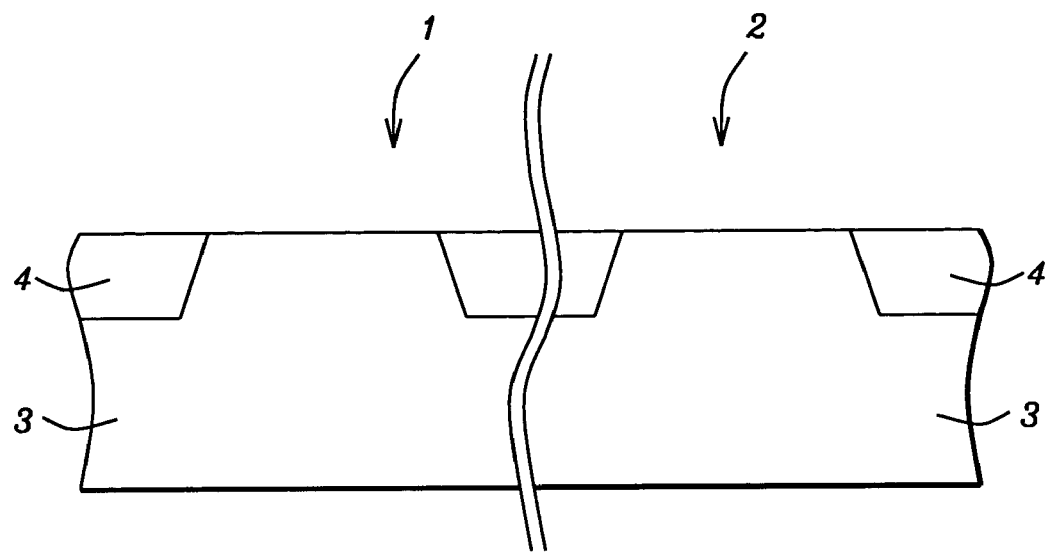
FIGS. 1–4, which schematically, in cross-sectional style, describe key fabrication stages employed to form dual gate insulator layers, each comprised of a specific thickness, featuring the use of HF type pre-cleans applied prior to formation of each of the gate insulator layers.

The method of forming dual gate insulator layers, each comprised of a specific thickness, featuring the use of HF type pre-cleans applied prior to formation of each of the gate insulator layers, will now be described in detail. Semiconductor substrate 3, comprised of P type, single crystalline silicon, featuring a <100> crystallographic orientation, is used and schematically shown in FIG. 1. Region 1, of semiconductor substrate 3, will be reserved for accommodation of I/O type, CMOS devices, wherein the I/O type devices will subsequently operate at higher voltages than counterpart core type CMOS devices, to subsequently by formed in region 2, of semiconductor substrate 3. Shallow trench isolation (STI), regions 4, comprised of silicon oxide filled shallow trench shapes, are formed for isolation between the I/O and core devices, as well as to isolate and define specific active device regions of each type CMOS device. This is schematically shown in FIG. 1.

Figure 2:
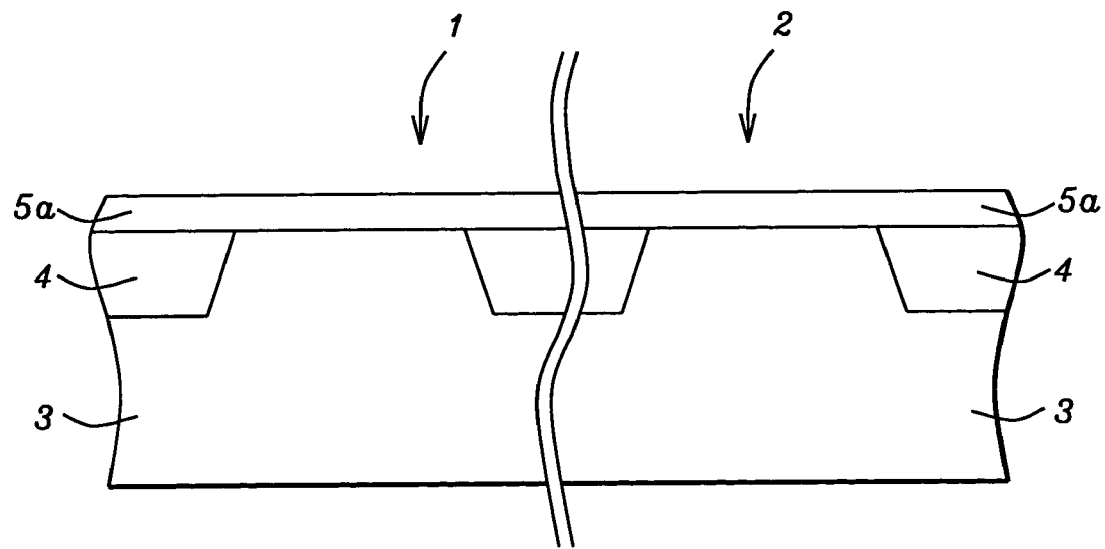

Prior to formation of a first gate insulator layer a first pre-clean procedure, performed using a solution containing an HF component, is employed. The solution used for the first pre-clean procedure can be a buffered HF solution, buffered by the inclusion of an ammonium fluoride component, or the solution can be a dilute HF solution, diluted via the use of addition of a de-ionized water component. If desired the first pre-clean procedure can be accomplished via a vapor HF procedure, performed in situ in the same chamber of tool to be subsequently used for a silicon nitride deposition. After the first pre-clean procedure removing native oxide from the entire surface of semiconductor substrate 3, silicon nitride layer 5a, is formed. Silicon nitride layer 5a, formed on the native oxide free semiconductor surface, is obtained at a thickness between about 5 to 30 Angstroms via use of either direct plasma nitridization procedures, direct thermal nitridation procedures, or chemical vapor deposition (CVD), procedures. Silicon nitride layer 5a, which will be used as the thin gate dielectric layer of core type CMOS devices, can also be obtained at a thickness between about 5 to 30 Angstroms, via rapid thermal chemical vapor deposition (RTCVD), via remote plasma enhanced chemical vapor deposition (RPCVD), or via atomic layer chemical vapor deposition (ALCVD), procedures. The result of the silicon nitride formation is schematically shown in FIG. 2.

Figure 3:
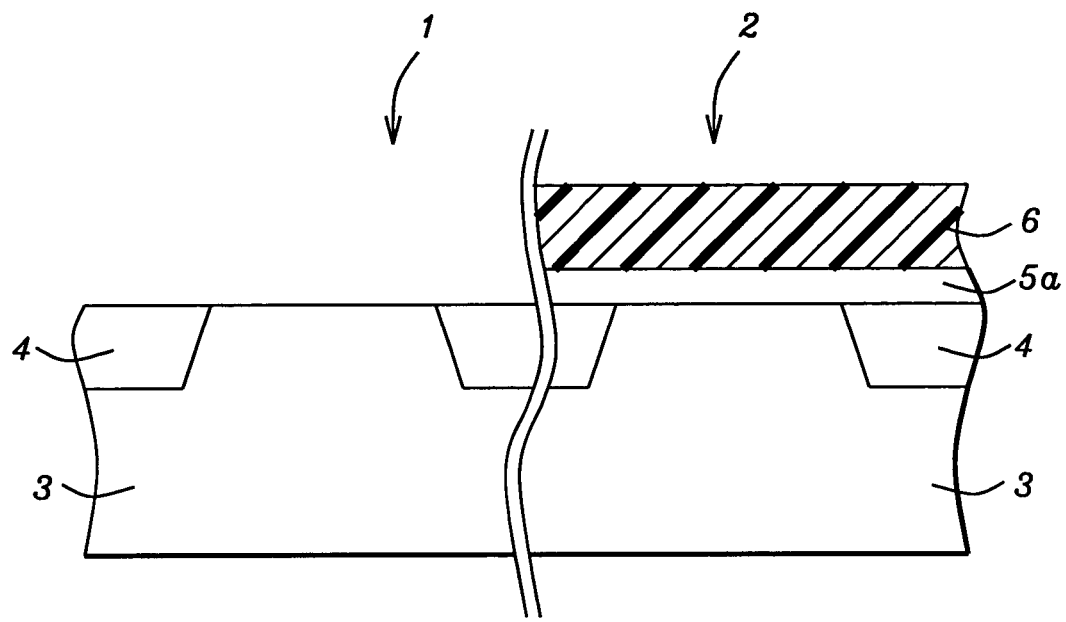

Silicon nitride layer 5a, will remain on semiconductor substrate 3, in core region 2, while I/O region 1, will be prepared for formation of a thicker gate insulator layer. Photoresist shape 6, is defined and used as an etch mask to protect silicon nitride layer 5a, from a procedure used to remove the portion of silicon nitride layer 5a, from the surface of semiconductor substrate 3, in I/O region 1. This can be accomplished selectively via use of a hot phosphoric acid solution which etches silicon nitride while the phosphoric acid procedure selectively terminates at the appearance of the top surface of semiconductor substrate 3. If desired selective removal of silicon nitride can be accomplished via dry etching procedures, using $CF_4$ or $Cl_2$ as a selective etchant for silicon nitride. The result of this procedure, featuring thin silicon nitride gate insulator layer 5a, only in core region 2, is schematically shown in FIG. 3.

Removal of photoresist shape 6, is accomplished via plasma oxygen ashing procedures, with this procedure forming an unwanted native oxide layer, (not shown in the drawings), on the exposed surface of semiconductor substrate 3, in I/O region 1. If the native oxide is not removed it will be incorporated into a subsequently regrown second gate insulator layer, with the inclusion of the native oxide resulting in decreased dielectric integrity of the regrown second gate insulator layer. Therefore a second pre-clean procedure is performed prior to growth of a second gate insulator layer, with the second pre-clean procedure again using an HF component to remove native oxide. Again as was the case with the first pre-clean procedure a wet etch solution such as a buffered HF solution, buffered by the inclusion of an ammonia fluoride component, or an HF solution, diluted via the use of addition of a de-ionized water component, can be used. If desired the second pre-clean procedure can be again be accomplished via a vapor HF procedure, performed in situ in the same chamber to be used for growth of a second gate insulator layer. Of upmost importance is the presence of silicon nitride as the first gate insulator layer. Silicon nitride gate insulator layer 5a, is not etched via exposure to the HF type environments during the second pre-clean procedure. If the first gate insulator layer in core region 2, were comprised of silicon dioxide, native oxide located on I/O region 1, could not have been removed via HF type procedures.

Figure 4:
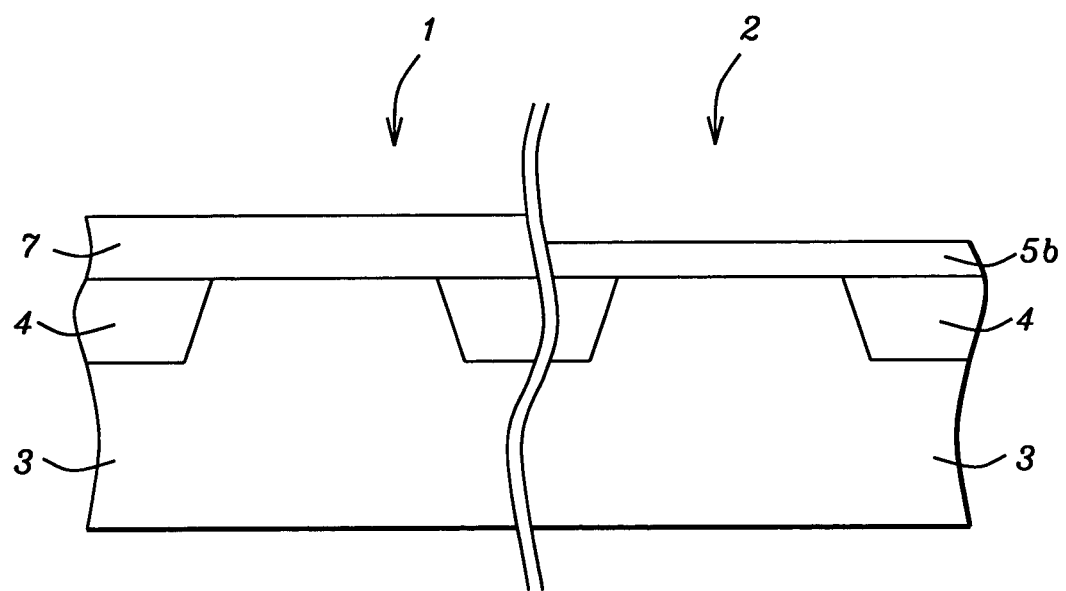

Formation of second gate insulator layer 7, comprised of silicon dioxide, is next accomplished and schematically shown in FIG. 4. Silicon dioxide layer 7, is obtained at a thickness between about 30 to 80 Angstroms via thermal oxidation procedures. If desired second gate insulator layer 7, can be obtained at the same thickness, between about 30 to 80 Angstroms, via plasma oxidation procedures. The formation of second gate insulator layer 7, in I/O region 1, at a thickness greater than the thickness of first gate insulator 5a, via thermal or plasma procedures, also results in removal of bulk traps in silicon nitride, resulting in a trap free, silicon nitride, first gate insulator layer 5b, shown schematically in FIG. 4. Therefore the thermal budget using the formation of second gate insulator layer 7, in combination with annealing of first gate insulator layer 5b, is reduced when compared to counterpart process sequences in which these procedures, formation of a second gate insulator and annealing of a first gate insulator layer, are performed separately.

If desired the present invention can be used to form multiple insulator layers, each with a specific thickness, for three or more gate insulator applications, with a HF type pre-clean performed prior to each gate insulator formation. This is accomplished via formation of a first silicon nitride gate insulator layer in a first region of a semiconductor substrate, comprised with a partial thickness of silicon nitride. After an HF pre-clean procedure deposition of a second silicon nitride layer on the pre-cleaned portion of semiconductor substrate results in a final thickness for the first silicon nitride thickness while the additional silicon nitride deposition results in a second silicon nitride gate insulator layer in the second semiconductor substrate region. After removal of the second silicon nitride layer from the surface of a third region of the semiconductor substrate, another HF type pre-clean procedure is applied followed by the growth of a third gate insulator layer, a silicon dioxide layer, on the third region of the semiconductor substrate.

While this invention has been particularly shown and described with reference to the preferred embodiments thereof, it will be understood by those skilled in the art that various changes in form and details may be made without departing from the spirit and scope of this invention.

What is claimed is:

1. A method of forming multiple gate insulator layers on semiconductor substrate having a core region and an input/output (I/O) region, the method comprising the steps of:
   forming a first insulator layer over a silicon containing semiconductor substrate;
   removing said first insulator layer from the I/O region of said semiconductor substrate, resulting in a first gate insulator layer having a first insulator thickness, located on the core region of said semiconductor substrate;
   performing a pre-clean procedure, wherein said pre-clean procedure can remove a native oxide from said semiconductor substrate; and
   selectively forming a second gate insulator layer, having a second insulator thickness, on said I/O region of said semiconductor substrate.

2. The method of claim 1, wherein a first pre-clean procedure is performed in a buffered hydrofluoric (BHF), acid solution, comprised of HF in ammonium fluoride, performed prior to formation of said first insulator layer.

3. The method of claim 2, wherein said first pre-clean procedure is a wet procedure, performed in a dilute HF acid solution, comprised of HF in de-ionized water.

4. The method of claim 2, wherein said first pre-clean procedure is a dry procedure, performed via use of HF vapors.

5. The method of claim 1, wherein said first insulator layer is a silicon nitride layer, comprised with said first insulator thickness is less than about 30 Angstroms and said second gate insulator layer is a silicon dioxide layer with said second gate insulator layer thickness greater than about 30 Angstroms.

6. The method of claim 1, wherein said first insulator layer is a silicon nitride layer, obtained via direct plasma nitridization on said semiconductor substrate.

7. The method of claim 1, wherein said first insulator layer is a silicon nitride layer, obtained via direct thermal nitridization procedures on said semiconductor substrate.

8. The method of claim 1, wherein said first insulator layer is a silicon nitride layer, obtained via rapid thermal chemical vapor deposition (RTCVD), procedures.

9. The method of claim 1, wherein said first insulator layer is a silicon nitride layer, obtained via remote plasma enhanced chemical vapor deposition (RPCVD), procedures.

10. The method of claim 1, wherein said first insulator layer is a silicon nitride layer, obtained via atomic layer chemical vapor deposition (ALCVD), procedures.

11. The method of claim 1, wherein said first insulator layer is removed from said second portion of said semiconductor substrate using a hot phosphoric acid solution as an etchant for said first insulator layer.

12. The method of claim 1, wherein said first insulator layer is removed from said second portion of said semiconductor substrate via dry etch procedures using $CF_4$ or $Cl_2$ as an etchant for said first insulator layer.

13. The method of claim 1, wherein said pre-clean procedure is a wet procedure, performed in a buffered hydrofluoric (BHF), acid solution, comprised of HF in ammonium fluoride.

14. The method of claim 1, wherein said pre-clean procedure is a wet procedure, performed in a dilute HF acid solution, comprised of HF in de-ionized water.

15. The method of claim 1, wherein said pre-clean procedure is a dry procedure, performed via use of HF vapors.

16. The method of claim 1, wherein said second gate insulator layer is a silicon dioxide layer, comprised with said second insulator thickness between about 30 to 80 Angstroms.

17. The method of claim 1, wherein said second gate insulator layer is formed via a thermal oxidation procedure, performed in an oxygen content ambient.

18. The method of claim 1, wherein said second gate insulator layer is formed via a plasma oxidation procedure, performed in an oxygen content ambient.

19. The method of claim 1, wherein said first gate insulator layer is annealed during formation of said second gate insulator layer.

20. A method of forming multiple thickness gate insulator layers on a silicon containing substrate, comprising the step of:

performing a first hydrofluoric (HF) pre-clean procedure;
forming a first dielectric layer over said silicon containing substrate, said forming of said first dielectric layer being carried out after said performing of said first hydrofluoric (HF) pre-clean procedure;
selectively removing using a photoresist shape said first dielectric layer from a second portion of said silicon containing substrate resulting in a first dielectric gate insulator layer, having a first insulator thickness, located on a first portion of said silicon containing substrate;
then removing said photoresist shape;
then performing a second hydrofluoric (HF) pre-clean procedure; and
performing an oxidation procedure to form a second dielectric gate insulator layer, having a second insulator thickness greater than the first thickness, on said second portion of said silicon containing substrate, said performing of said oxidation procedure being carried out after said performing of said second hydrofluoric (HF) pre-clean procedure, wherein the removal rate of said second dielectric gate insulator layer is higher than the removal rate of said first dielectric layer using a prescribed etchant.

21. The method of claim 20, wherein said first HF pre-clean procedure is performed in a buffered hydrofluoric (BHF), acid solution, comprised of HF in ammonium fluoride, or performed in a dilute HF acid solution, comprised of HF in de-ionized water.

22. The method of claim 20, wherein said first HF pre-clean procedure is performed layer via use of HF vapors.

23. The method of claim 20, wherein said first dielectric layer is a silicon nitride layer, obtained at a thickness between about 5 to 30 Angstroms, via a direct plasma nitridization procedure, performed on said silicon containing substrate.

24. The method of claim 20, wherein said first dielectric layer is a silicon nitride layer, obtained at a thickness between about 5 to 30 Angstroms, via direct thermal nitridization on said silicon containing substrate.

25. The method of claim 20, wherein said first dielectric layer is a silicon nitride layer, obtained at a thickness between about 5 to 30 Angstroms, via rapid thermal chemical vapor deposition (RTCVD), procedures, or performed via remote plasma enhanced chemical vapor deposition (RPCVD), procedures, performed using silane or disilane, and ammonia as reactants.

26. The method of claim 20, wherein said first dielectric layer is a silicon nitride layer, obtained at a thickness between about 5 to 30 Angstroms, via atomic layer chemical vapor deposition (ALCVD), procedures.

27. The method of claim 20, wherein said first dielectric layer is selectively removed from said second portion of said semiconductor substrate using a hot phosphoric acid solution as an etchant.

28. The method of claim 20, wherein said first dielectric layer is selectively removed from said second portion of said semiconductor substrate via dry etch procedures using $CF_4$ or $Cl_2$ as an etchant.

29. The method of claim 20, wherein said second HF pre-clean procedure is performed in a buffered hydrofluoric (BHF), acid solution, comprised of HF in ammonium fluoride, or performed in a dilute HF acid solution, comprised of HF in de-ionized water.

30. The method of claim 20, wherein said second dielectric gate insulator layer is a silicon oxide gate insulator layer is comprised with a thickness between about 30 to 80 Angstroms.

31. The method of claim 20, wherein said second HF pre-clean procedure is performed via use of HF vapors.

32. The method of claim 20, wherein said oxidation procedure used to form said second dielectric gate insulator layer is a thermal oxidation procedure, performed at a temperature between about 500 to 1100° C., in an oxygen content ambient.

33. The method of claim 20, wherein said procedure used to form said second dielectric gate insulator layer is a plasma oxidation procedure, performed at a temperature between about 25 to 800° C., in an oxygen content ambient.

* * * * *